(12) United States Patent
Huang et al.

(10) Patent No.: US 11,049,904 B1
(45) Date of Patent: Jun. 29, 2021

(54) RRAM STRUCTURE AND METHOD OF FABRICATING THE SAME

(71) Applicant: United Semiconductor (Xiamen) Co., Ltd., Fujian (CN)

(72) Inventors: Chin-Chun Huang, Hsinchu County (TW); Yun-Pin Teng, Tainan (TW); Jinjian Ouyang, Fujian (CN); Wen Yi Tan, Fujian (CN)

(73) Assignee: United Semiconductor (Xiamen) Co., Ltd., Xiamen (CN)

(*) Notice: Subject to any disclaimer, the term of this patent is extended or adjusted under 35 U.S.C. 154(b) by 0 days.

(21) Appl. No.: 16/741,698

(22) Filed: Jan. 13, 2020

(30) Foreign Application Priority Data

Dec. 30, 2019 (CN) .......................... 201911390437.X

(51) Int. Cl.
*H01L 27/24* (2006.01)
*H01L 45/00* (2006.01)
*H01L 29/66* (2006.01)
*H01L 29/45* (2006.01)
*H01L 29/08* (2006.01)

(52) U.S. Cl.
CPC ...... *H01L 27/2436* (2013.01); *H01L 29/0847* (2013.01); *H01L 29/456* (2013.01); *H01L 29/665* (2013.01); *H01L 29/66636* (2013.01); *H01L 45/1233* (2013.01); *H01L 45/1253* (2013.01); *H01L 45/146* (2013.01); *H01L 45/1683* (2013.01)

(58) Field of Classification Search
None
See application file for complete search history.

(56) References Cited

U.S. PATENT DOCUMENTS

| | | | | |
|---|---|---|---|---|
| 10,283,564 | B1* | 5/2019 | Liu | H01L 27/2463 |
| 10,580,977 | B2* | 3/2020 | Reznicek | H01L 45/1206 |
| 2013/0221317 | A1* | 8/2013 | Pramanik | H01L 45/1658 257/5 |
| 2019/0148638 | A1* | 5/2019 | Sung | H01L 45/1253 257/4 |
| 2020/0035915 | A1* | 1/2020 | Reznicek | H01L 45/145 |

* cited by examiner

*Primary Examiner* — J. E. Schoenholtz
(74) *Attorney, Agent, or Firm* — Winston Hsu

(57) ABSTRACT

An RRAM structure includes a substrate. An RRAM is embedded in the substrate. The RRAM includes a bottom electrode, a metal oxide layer and a top electrode. A first doped region is embedded in the substrate and surrounds the bottom electrode. A transistor is disposed on the substrate and at one side of the RRAM. The transistor includes a gate structure on the substrate. A source is disposed in the substrate and at one side of the gate structure. A drain is disposed in the substrate and at another side of the gate structure. The first doped region contacts the drain.

14 Claims, 4 Drawing Sheets

RRAM STRUCTURE AND METHOD OF FABRICATING THE SAME

BACKGROUND OF THE INVENTION

1. Field of the Invention

The present invention relates to a resistive random access memory (RRAM) structure and a fabricating method of the RRAM structure, and more particularly to an RRAM structure with an RRAM embedded in the substrate and a fabricating method of the same.

2. Description of the Prior Art

Nonvolatile memory is capable of retaining the stored information even when unpowered. Non-volatile memory may be used for secondary storage or long-term persistent storage. RRAM technology has been gradually recognized as having exhibited those semiconductor memory advantages.

RRAM cells are non-volatile memory cells that store information by changes in electric resistance, not by changes in charge capacity. In general, the resistance of the resistive layer varies according to an applied voltage. An RRAM cell can be in a plurality of states in which the electric resistances are different. Each different state may represent a digital information. The state can be changed by applying a predetermined voltage or current between the electrodes. A state is maintained as long as a predetermined operation is not performed.

Conventional RRAMs are often inserted between the metal interconnections at the back end of line (BEOL) by replacing the position of part of the plugs. However, the conventional way needs several extra photomasks to define the RRAM. Furthermore, in order to match the thickness of the metal interconnection, the thicknesses of the top electrode, the bottom electrode and metal oxide layer of the RRAM can't be adjusted arbitrarily.

SUMMARY OF THE INVENTION

In light of the above, the present invention provides an RRAM structure which has an RRAM embedded in the substrate to solve the above mentioned problems.

According to a preferred embodiment of the present invention, an RRAM structure includes a substrate. An RRAM is embedded in the substrate, wherein the RRAM includes a bottom electrode, a metal oxide layer and a top electrode. A first doped region is embedded in the substrate and surrounds the bottom electrode. A transistor is disposed on the substrate and at one side of the RRAM. The transistor includes a gate structure on the substrate. A source is disposed in the substrate and at one side of the gate structure. A drain is disposed in the substrate and at another side of the gate structure. The first doped region contacts the drain.

According to another preferred embodiment of the present invention, a fabricating method of an RRAM structure includes providing a substrate. Later, a recess is formed in the substrate. Next, a first doped region is formed at a bottom of the recess by implanting dopants. Subsequently, a bottom electrode, a metal oxide layer and a top electrode are formed in sequence to fill in the recess and cover a top surface of the substrate. After that, a planarization process is performed to remove the bottom electrode, the metal oxide layer and the top electrode outside of the recess, wherein the bottom electrode, the metal oxide layer and the top electrode remained in the recess form an RRAM. Finally, after the planarization process, a transistor is formed to be disposed on the substrate and at one side of the RRAM.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 7 depict a fabricating method of an RRAM structure according to a preferred embodiment of the present invention, wherein:

FIG. 1 depicts a substrate with a first doped region;
FIG. 2 depicts a fabricating stage following FIG. 1;
FIG. 3 depicts a fabricating stage following FIG. 2;
FIG. 4 depicts a fabricating stage following FIG. 3;
FIG. 5 depicts a fabricating stage following FIG. 4;
FIG. 6 depicts a fabricating stage following FIG. 5;
and
FIG. 7 depicts a fabricating stage following FIG. 6.

DETAILED DESCRIPTION

FIG. 1 to FIG. 7 depict a fabricating method of an RRAM structure according to a preferred embodiment of the present invention.

Figure 1:
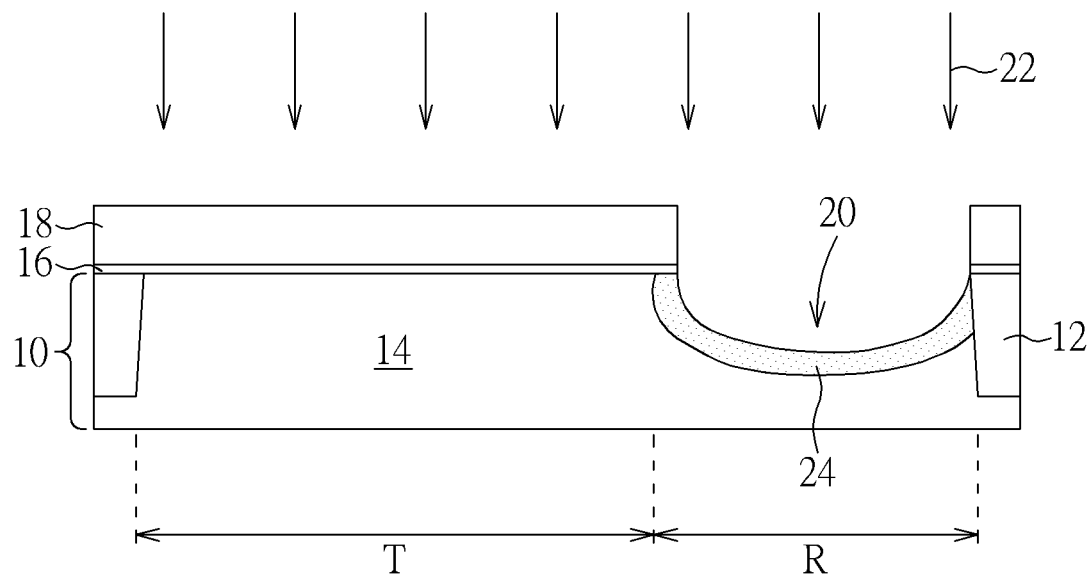
Figure 2:
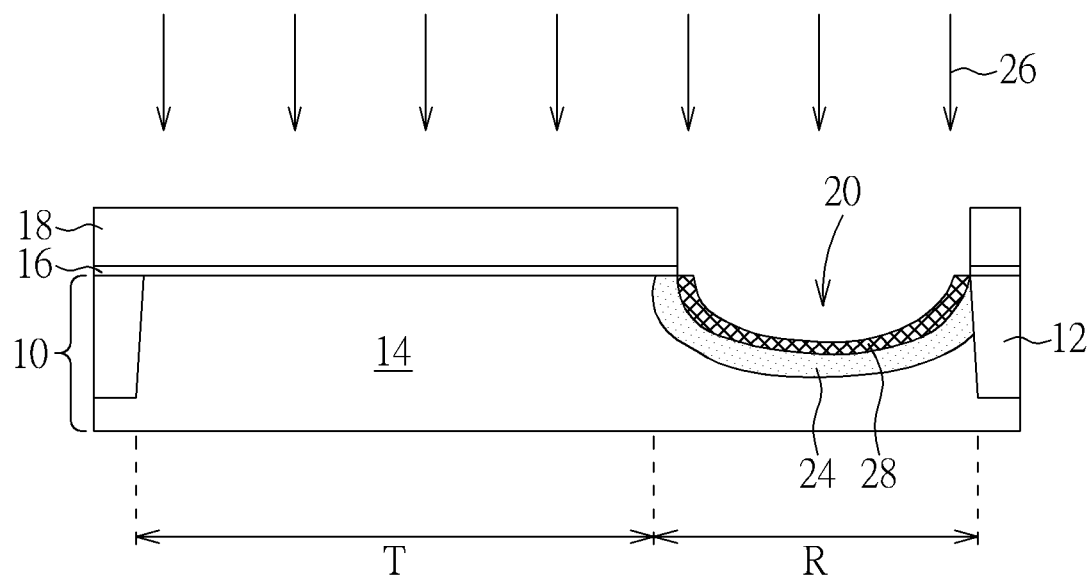

As shown in FIG. 1, a substrate 10 is provided. The substrate 10 may be a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. Numerous shallow trench isolations 12 are disposed in the substrate 10 to define an active area 14. The active area 14 is divided into a transistor region T and a memory region R. The transistor region T is adjacent to the memory region R. Later, a silicon oxide layer 16 and a photoresist 18 are formed on the substrate 10. Then, the photoresist 18 is patterned to form an opening in the photoresist 18 within the memory region R. Next, the substrate 10 is etched by taking the photoresist 18 as a mask to form a recess 20 in the substrate 10. After that, an ion implantation process is performed to implant dopants into the substrate 10 at a bottom of the recess 20 to form a first doped region 24 in the substrate 10. The dopants implanted can be N-type dopants or P-type dopants. According to a preferred embodiment of the present invention, the dopants are N-type such as phosphorus or arsenic. As shown in FIG. 2, a silicide process is performed to transform the top surface of the substrate 10 which is exposed through the photoresist 18 into a metal silicide layer 28. In other words, the bottom of the recess 20 which is also a surface of the first doped region 24 is transformed into the metal silicide layer 28.

Figure 3:
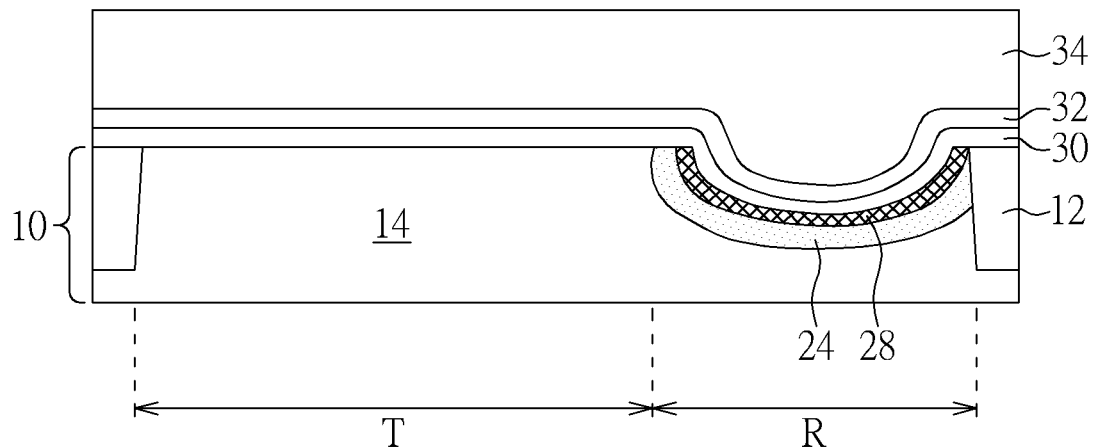

As shown in FIG. 3, the photoresist 18 and the silicon oxide layer 16 are removed. Then, a bottom electrode 30 is formed to cover the substrate 10 and conformally cover the recess 20 (please refer to FIG. 1 for the position of the recess 20). Later, a metal oxide layer 32 is formed to cover the bottom electrode 30 and conformally fill into the recess 20. Subsequently, a top electrode 34 is formed to cover the metal oxide layer 32 and fill in the recess 20. Now, the recess 20 is filled up by the metal silicide layer 28, the bottom electrode 30, the metal oxide layer 32 and the top electrode 34. Moreover, part of the top electrode 34, part of the metal oxide layer 32 and part of the bottom electrode 30 are higher than the recess 20 and outside of the recess 20. The top electrode 34 includes titanium nitride or tantalum nitride. The bottom electrode 30 includes titanium nitride or tantalum nitride. The metal oxide layer 32 includes tantalum oxide, hafnium oxide, titanium oxide or aluminum oxide.

Figure 4:
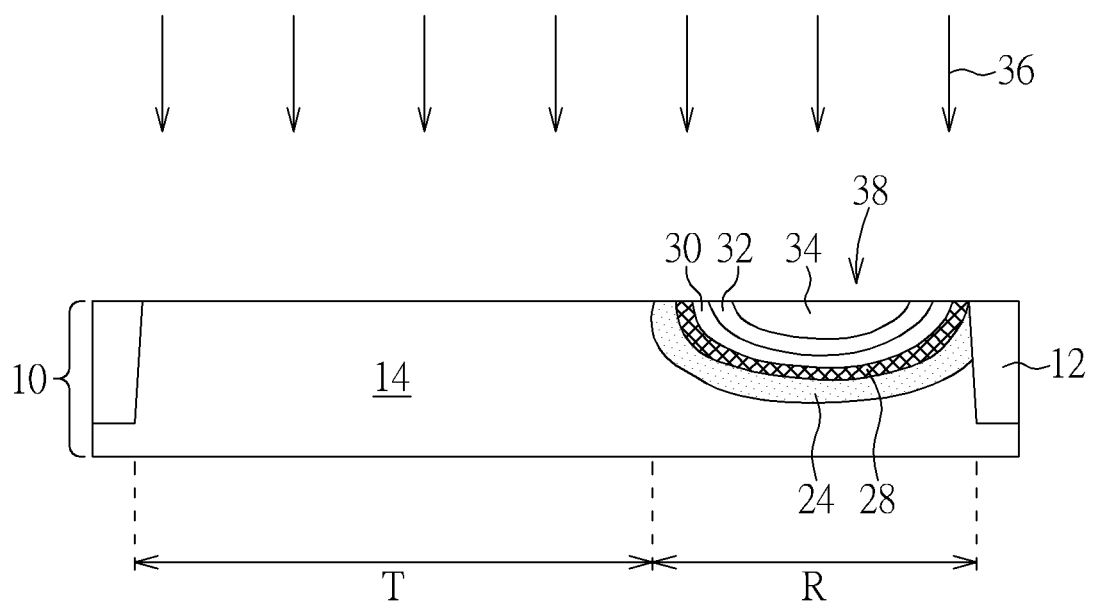

As shown in FIG. 4, a planarization process 36 such as a chemical mechanical planarization is performed to remove the bottom electrode 30, the metal oxide layer 32 and the top electrode 34 outside of the recess 20 (please refer to FIG. 1 for the position of the recess 20). After the planarization process 36, the bottom electrode 30, the metal oxide layer 32 and the top electrode 34 remained in the recess 20 form an RRAM 38. Moreover, two ends of the bottom electrode 30, two ends of the metal oxide layer 32, the top surface of the top electrode 34 and two ends of the metal silicide layer 28 are aligned with the top surface of the substrate 10.

Figure 5:
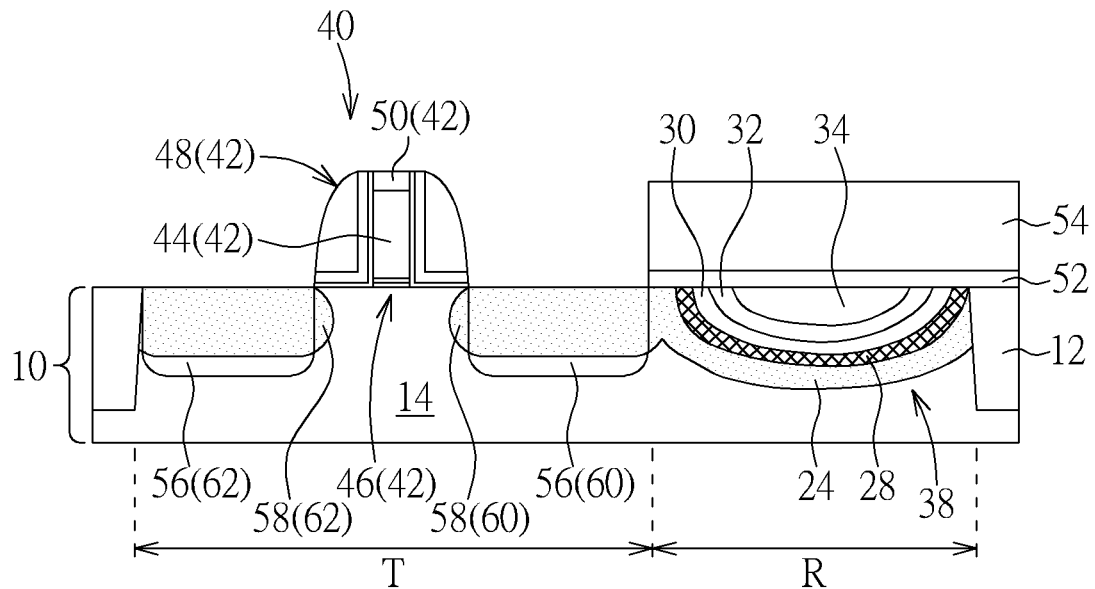

As shown in FIG. 5, a transistor 40 is formed on the substrate 10 at one side of the RRAM 38. In details, the transistor 40 is formed within the transistor region T on the substrate 10. The steps of forming the transistor 40 include forming a gate structure 42 on the substrate 10. The gate structure 42 includes a gate 44, a gate dielectric layer 46, a spacer 48 and a cap layer 50. The gate 44 may be doped polysilicon. The gate dielectric layer 46 may be oxide, silicon oxide, silicon oxynitride (SiON), silicon nitride ($Si_3N_4$), tantalum oxide ($Ta_2O_5$), aluminum oxide ($Al_2O_5$), hafnium oxide ($HfO_2$), nitrogen-containing material, hafnium-containing material, tantalum-containing material, aluminum-containing material or high-k dielectrics having a dielectric constant greater than 5, or any combination thereof. The spacer 48 and the cap layer 50 may include silicon nitride.

The gate dielectric layer 46 is between the gate 44 and the substrate 10. The spacer 48 surrounds the gate 44 and the gate dielectric layer 46. The cap layer 50 covers the gate 44. Later, a hard mask 52 and a photoresist 54 are formed to cover the RRAM 38 and expose the transistor region T. The hard mask 52 may be silicon nitride. Next, the substrate 10 is etched by taking the hard mask 52, the photoresist 54 and the gate structure 42 as a mask to form a recess respectively at two sides of the gate structure 42 in the substrate 10. After that, an epitaxial process is performed to form silicon-containing layer 56 such as silicon phosphorus, silicon germanium or silicon carbide in the recess. According to a preferred embodiment of the present invention, the silicon-containing layer 56 is silicon phosphorus. Subsequently, an ion implantation process is performed to form a second doped region 58 respectively in the silicon-containing layer 56 at two sides of the gate structure 52. The dopants in the second doped region 58 can be N-type dopants or P-type dopants. According to a preferred embodiment of the present invention, the dopants are N-type such as phosphorus or arsenic. Then, a thermal process is performed to drive in the dopants in the second doped region 58. Now, the second doped region 58 and the silicon-containing layer 56 nearer the RRAM 38 form a drain 60. The second doped region 58 and the silicon-containing layer 56 farther from the RRAM 38 form a source 62. It is noteworthy that because the thermal process diffuses dopants, the second doped region 58 in the drain 60 contacts the first doped region 24. Moreover, the gate structure 42, the drain 60 and the source 62 form the transistor 40.

Figure 6:
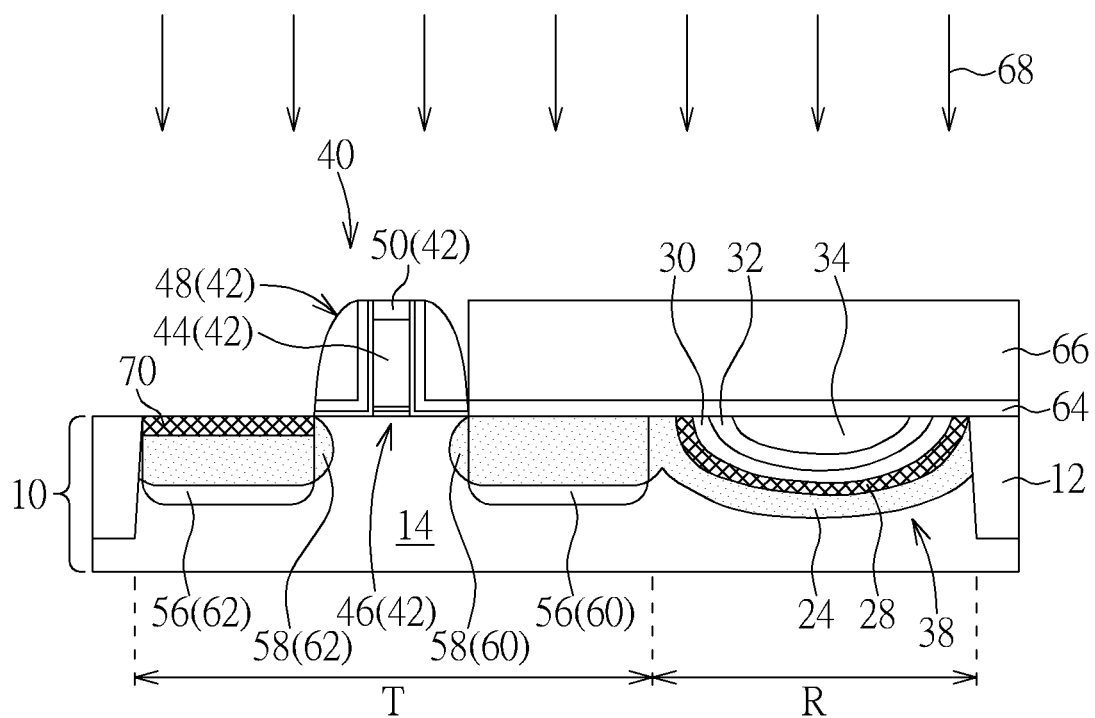

As shown in FIG. 6, the photoresist 54 and the hard mask 52 are removed. Then, a hard mask 64 is formed to cover the RRAM 38 and the drain 60. The hard mask 64 is preferably silicon oxide. Next, a salicide block (SAB) 66 is formed to cover the hard mask 64. Later, a silicide process 68 is performed to form a metal silicide layer 70 on the source 62.

In addition, because the SAB 66 covers the drain 60, the metal silicide layer 70 doesn't form on the drain 60.

Figure 7:
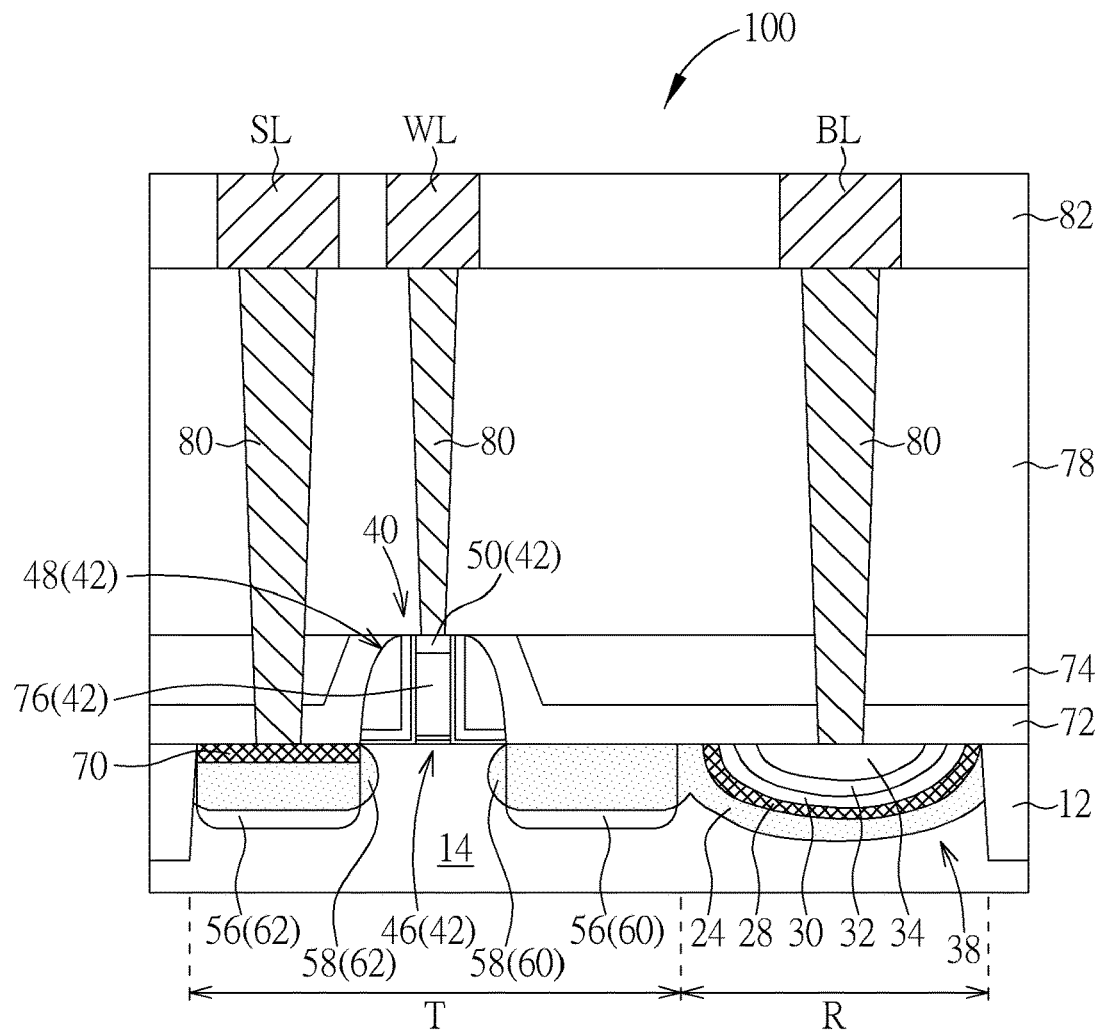

As shown in FIG. 7, the hard mask 64 and the SAB 66 are removed. Later, an etch stop layer 72 is formed to conformally cover the substrate 10, the transistor 40 and the RRAM 38. The etch stop layer 72 may be silicon nitride. Next, an interlayer dielectric 74 is formed to cover the etch stop layer 72. Then, the interlayer dielectric 74 and the etch stop layer 72 are etched to expose the gate 44. Subsequently, the gate 44 is removed, and a metal gate 76 is formed to fill in the position where the gate 44 originally disposed. The metal gate 76 can be tungsten, tungsten nitride, aluminum, other metals or alloy. Later, an inter-metal dielectric 78 is formed to cover the interlayer dielectric 74. Next, numerous plugs 80 are formed to penetrate the interlayer dielectric 74 and the etch stop layer 72. The plugs 80 respectively contact the metal gate 76, the top electrode 34 of the RRAM 38 and the metal silicide layer 70 on the source 62. It is noteworthy that the drain 60 doesn't contact any plugs.

Next, another inter-metal dielectric 82 is formed to cover the inter-metal dielectric 78. The inter-metal dielectrics 78/82 and the interlayer dielectric 74 may include silicon oxide, borophosphosilicate glass (BPSG), spin-on glass (SOG), or fluorosilicate glass (FSG), or other materials. The etch stop layer 72 may be silicon nitride.

Next, a source line SL, a word line WL and a bit line BL are formed to respectively contact one of the plug 80. The source line SL electrically connects to the source 62, the word line electrically connects to the metal gate 76, and the bit line BL electrically connects the RRAM 38.

Moreover, if the transistor 40 uses gate 44 and doesn't need the metal gate 76, the steps of etching back to expose the gate 40 can be omitted. Then, the interlayer dielectric 74, the inter-metal dielectrics 78/82 and the plugs 80 are formed after the etch stop layer 72 is formed.

As shown in FIG. 7, an RRAM structure 100 includes a substrate 10. An RRAM 38 is embedded in the substrate 10. The RRAM 38 includes a bottom electrode 30, a metal oxide layer 32 and a top electrode 34. A first doped region 24 is embedded in the substrate 10 and surrounding the bottom electrode 30. A metal silicide layer 28 is disposed between the first doped region 24 and the bottom electrode 30. The metal silicide layer 28 contacts and surrounds the bottom electrode 30. The metal silicide layer 28 may be nickel silicide (NiSi). The top electrode 34 includes titanium nitride or tantalum nitride. The bottom electrode 30 includes titanium nitride or tantalum nitride. The metal oxide layer 32 includes tantalum oxide, hafnium oxide, titanium oxide or aluminum oxide.

Figure 8:
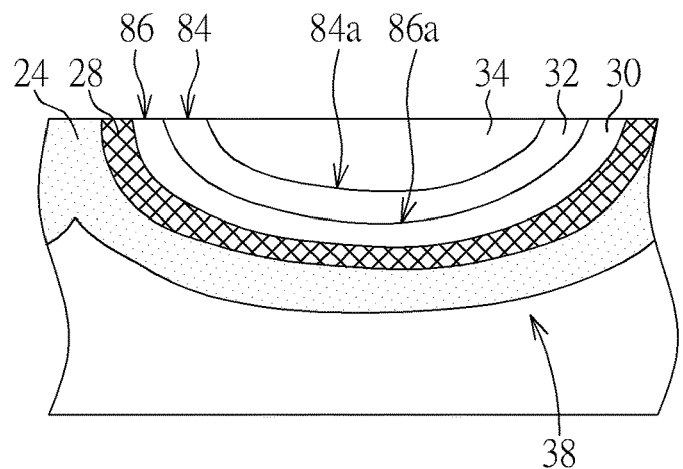
FIG. 8 shows an enlarged view of an RRAM.

FIG. 8 shows an enlarged view of an RRAM. Please refer to FIG. 8, the metal oxide layer 32 includes a first concave profile 84. The bottom electrode 30 includes a second concave profile 86. An opening 84a of the first concave profile 84 faces the top surface of the substrate 10. The opening 86a of the second concave profile 86 also faces the top surface of the substrate 10. The top surface of the top electrode 34 is aligned with the top surface of the substrate 10. Two ends of the first concave profile 84 are aligned with the top surface of the substrate 10. Two ends of the second concave profile 86 are aligned with the top surface of the substrate 10.

Please refer to FIG. 7. A transistor 40 is disposed on the substrate 10 and at one side of the RRAM 38. The transistor 40 includes a gate structure 42 on the substrate 10. A source 62 is disposed in the substrate 10 and at one side of the gate structure 42. A drain 60 is disposed in the substrate 10 and at another side of the gate structure 42. The first doped region 24 contacts the drain 60.

The source 62 includes a silicon-containing epitaxial layer 56 embedded in the substrate 10 and a second doped region 58. The drain 60 includes another silicon-containing epitaxial layer 56 embedded in the substrate 10 and another second doped region 58. The first doped region 24 contacts the second doped region 58 of the drain 60. The first doped region 24 and the second doped region 58 may respectively include N-type or P-type dopants. The silicon-containing epitaxial layer 56 may be silicon phosphorus, silicon germanium or silicon carbide. According to a preferred embodiment of the present invention, the silicon-containing epitaxial layer 56 is silicon phosphorus. Both the first doped region 24 and the second doped region 58 include N-type dopants. That is, the transistor 40 of the present invention is preferably an N-type transistor. A metal silicide 70 is disposed on the source 62 and contacts the source 62. However, there is not any metal silicide layer contacting the top surface of the drain 60. The metal silicide 70 may be nickel silicide (NiSi).

The RRAM of the present invention is embedded in the substrate; therefore, the positions of the top electrode, the metal oxide layer and the bottom electrode can be defined by using a chemical mechanical planarization to remove the top electrode, the metal oxide layer and the bottom electrode outside of the recess. Furthermore, because the RRAM of the present invention is completed at the front end of line (FEOL), the thicknesses of the top electrode, the metal oxide layer and the bottom electrode can be adjusted with more flexibility.

On the contrary, the conventional RRAM is inserted between the metal interconnections. That is the back end of line. In this way, the conventional RRAM needs more photomasks to define the position of the RRAM; therefore, the fabricating process is more complicated. Moreover, because the conventional RRAM needs to match the thickness of the metal interconnections, the thicknesses of the top electrode, the metal oxide layer and the bottom electrode can't be changed arbitrarily.

Furthermore, in the RRAM structure of the present invention, there is no metal silicide layer on the drain, and the RRAM is surrounded by another metal silicide layer. This design is to make the current from the source can flow through the channel under the gate structure, pass the second doped region of the drain and enter the RRAM, rather than leaking from the top surface of the drain. Moreover, no metal silicide layer on the drain can also make the current flow into a deeper position of the drain instead of passing on the top surface of the drain. In this way, the total current path is elongated, and the reliability of the RRAM can be increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An RRAM structure, comprising:
    a substrate;
    an RRAM embedded in the substrate, wherein the RRAM comprises a bottom electrode, a metal oxide layer and a top electrode;
    a metal silicide layer contacting and surrounding the RRAM;
    a first doped region embedded in the substrate and surrounding the bottom electrode; and
    a transistor disposed on the substrate and at one side of the RRAM, wherein the transistor comprises:
        a gate structure on the substrate;
        a source disposed in the substrate and at one side of the gate structure; and
        a drain disposed in the substrate and at another side of the gate structure; wherein the first doped region contacts the drain.

2. The RRAM structure of claim 1, wherein the metal oxide layer surrounds the top electrode, the bottom electrode surrounds the metal oxide layer.

3. The RRAM structure of claim 2, wherein the metal oxide layer has a first concave profile, the bottom electrode has a second concave profile, an opening of the first concave profile faces a top surface of the substrate, an opening of the second concave profile faces the top surface of the substrate.

4. The RRAM structure of claim 3, wherein a top surface of the top electrode is aligned with the top surface of the substrate, two ends of the first concave profile are aligned with the top surface of the substrate, and two ends of the second concave profile are aligned with the top surface of the substrate.

5. The RRAM structure of claim 1, wherein the source and the drain respectively comprise a second doped region embedded in the substrate.

6. The RRAM structure of claim 5, wherein the source and the drain respectively comprise a silicon-containing epitaxial layer embedded in the substrate.

7. The RRAM structure of claim 5, wherein both of the first doped region and the second doped region comprise N-type dopants.

8. The RRAM structure of claim 1, wherein a top surface of the drain does not contact with any metal silicide layer.

9. The RRAM structure of claim 1, wherein a metal silicide layer is disposed on and contacts a top surface of the source.

10. A fabricating method of an RRAM structure, comprising:
    providing a substrate;
    forming a recess in the substrate;
    forming a first doped region at a bottom of the recess by implanting dopants;
    forming a bottom electrode, a metal oxide layer and a top electrode in sequence to fill in the recess and cover a top surface of the substrate;
    performing a planarization process to remove the bottom electrode, the metal oxide layer and the top electrode outside of the recess, wherein the bottom electrode, the metal oxide layer and the top electrode remained in the recess form an RRAM; and
    after the planarization process, forming a transistor disposed on the substrate and at one side of the RRAM.

11. The fabricating method of an RRAM structure of claim 10, wherein steps of fabricating the transistor comprising:
    forming a gate structure on the substrate; and
    forming a source embedded in the substrate and a drain embedded in the substrate, wherein the source is disposed at one side of the gate structure, the drain is disposed at another side of the gate structure, and the drain contacts the first doped region.

12. The fabricating method of an RRAM structure of claim 11, wherein the steps of forming the source and the drain includes:
    forming a second doped region respectively at two side of the gate structure.

13. The fabricating method of an RRAM structure of claim 11, further comprising:
   forming a mask covering the drain; and
   performing a silicide process to form a metal silicide layer on the source, wherein while performing the silicide process, the drain is covered by the mask.

14. The fabricating method of an RRAM structure of claim 11, further comprising:
   after forming the transistor, forming an interlayer dielectric covering the transistor and the RRAM;
   forming a first plug, a second plug, and a third plug penetrating the interlayer dielectric, wherein the first plug electrically connects to the source, the second plug contacts the gate structure and the third plug contacts the top electrode of the RRAM; and
   forming a source line, a word line and a bit line, wherein the source line contacts the first plug, the word line contacts the second plug and the bit line contacts the third plug.

* * * * *